(12) United States Patent
Takeda et al.

(10) Patent No.: US 6,385,021 B1
(45) Date of Patent: May 7, 2002

(54) ELECTROSTATIC DISCHARGE (ESD) PROTECTION CIRCUIT

(75) Inventors: Fujio Takeda; James W. Miller, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/546,601

(22) Filed: Apr. 10, 2000

(51) Int. Cl.[7] .................................. H02H 3/22
(52) U.S. Cl. ........................... 361/56; 361/111
(58) Field of Search ................. 361/54, 56, 111; 257/355.363; 327/306, 309, 310, 311, 318

(56) References Cited

U.S. PATENT DOCUMENTS

| | | |
|---|---|---|
| 5,311,391 A | 5/1994 | Dungan et al. |
| 5,361,185 A | 11/1994 | Yu ........................ 361/111 |
| 5,610,790 A * | 3/1997 | Staab et al. ............... 361/56 |
| 5,721,656 A | 2/1998 | Wu et al. |
| 5,751,051 A | 5/1998 | Hayano |
| 5,825,600 A * | 10/1998 | Watt ........................ 361/56 |
| 5,946,177 A | 8/1999 | Miller et al. .............. 361/56 |
| 5,991,134 A | 11/1999 | Tan et al. |
| 6,002,156 A * | 12/1999 | Lin ........................ 257/356 |
| 6,222,710 B1 * | 4/2001 | Yamaguchi ............... 361/56 |

FOREIGN PATENT DOCUMENTS

| | | |
|---|---|---|
| EP | 0026056 A1 | 4/1981 |
| FR | 2704991 | 11/1994 |
| GB | 2286287 A | 8/1995 |

* cited by examiner

*Primary Examiner*—Kim Huynh
(74) *Attorney, Agent, or Firm*—Joanna G. Chiu

(57) ABSTRACT

An ESD protection circuit (39) coupled to each of a plurality of I/O circuits (30, 32, 36) of an integrated circuit (31) is disclosed. The ESD protection circuit includes a MOSFET transistor (40) to provide primary ESD protection on occurrence of an ESD event. In one embodiment, the control electrode of the MOSFET transistor is coupled to a first buffer circuit (42). Integrated circuit (31) includes a remote trigger circuit (37) coupled to the ESD protection circuits via a trigger bus (47). The individual ESD protection circuits operate in parallel to provide ESD protection to the I/O circuits (30, 32, and 36) upon occurrence of an ESD event.

22 Claims, 4 Drawing Sheets

ELECTROSTATIC DISCHARGE (ESD) PROTECTION CIRCUIT

FIELD OF THE INVENTION

This invention relates generally to semiconductor circuits providing electrostatic discharge (ESD) protection, and specifically to a distributed ESD protection scheme.

RELATED ART

An integrated circuit may be subjected to an Electrostatic Discharge (ESD) event both in the manufacturing process and in the ultimate system application. The energy associated with this transient discharge can easily damage the fragile devices present in a modern integrated circuit (IC). External pins or pads form the connection points for the integrated circuit to the outside world and therefore serve as pathways for ESD events. An ESD event applied to a pad may couple a voltage exceeding a thousand volts to circuitry coupled to the pad.

In conventional IC ESD protection schemes, special clamp circuits are often used to shunt ESD current between the IC power supply rails and thereby protect internal elements from damage. A type of ESD clamp circuit, known as an active metal oxide semiconductor field effect transistor (MOSFET) clamp circuit, typically consists of three functional elements: a trigger circuit, an intermediate buffer circuit, and a large MOSFET transistor. The trigger circuit is designed to respond to an applied ESD event but remain inactive during normal operation of the IC. The buffer circuit is used to amplify the trigger output in order to drive the gate terminal of the large MOSFET transistor. The large MOSFET transistor, connected between the two power supply rails, acts as the primary ESD current dissipation device in the clamp circuit. Active MOSFET clamps circuits typically rely on only MOSFET action to shunt ESD current between the rails. Since the peak current in an ESD event may be on the order of amperes, very large MOSFET transistor sizes are required A known transient-triggered active MOSFET ESD clamp circuit 10 is shown in FIG. 1. The clamp circuit 10 in FIG. 1 protects a VDD power supply rail 1 from positive ESD events referenced to a grounded VSS power supply rail 2. As shown in FIG. 1 clamp circuit 10 employs a trigger circuit 8, a buffer circuit 3, and a large N-channel MOSFET (NMOSFET) transistor 4. Trigger circuit 8 is designed as a resistor-capacitor (RC) transient detector, utilizing resistor 6 and capacitor 7. In response to an ESD event that induces a rapid positive voltage increase on the VDD rail 1, trigger circuit 8 initially holds a node 5 well below VDD. The buffer circuit 3, with an input connected to node 5, then drives the gate of NMOSFET 4 to VDD, thereby turning on the device. Once turned on, NMOSFET 4 acts as a low resistance shunt between the VDD rail 1 and the VSS rail 2. NMOSFET 4 will remain conductive for a period of time which is determined by the RC time constant of trigger circuit 8. As a result, this RC time constant should be set long enough to exceed the maximum expected duration of an ESD event, typically three to five hundred nanoseconds, while short enough to avoid false triggering of the clamp circuit during normal ramp-up of the VDD power rail. This VDD ramp-up during normal operation typically requires two to five milliseconds. Note that once VDD reaches a constant power supply level, NMOSFET 4 is biased in a nonconductive state as required for normal operation.

A limitation with the clamp circuit of prior art FIG. 1 is that such a clamp circuit encompasses a large substrate area. It is typical for such a clamp circuit to occupy an area comparable to a wire bond pad. The large size of NMOSFET 4 in FIG. 1 is unavoidable since the performance of an active MOSFET ESD clamp circuit is directly proportional to the channel width (dimension perpendicular to current flow) of this device. In a typical implementation, NMOSFET 4 in FIG. 1 may be sized with a channel width of approximately 2000 microns. Other portions of the clamp circuit, particularly the trigger circuit 8, also occupy a significant portion of the overall clamp area. The area utilized by trigger circuit 8, including resistor 6 and capacitor 7 commonly represents up to 50 percent of the total clamp circuit area. Trigger circuit 8 requires this significant area in order to achieve the required RC time constant of three to five hundred nanoseconds.

The large size of the active MOSFET ESD clamp circuit of FIG. 1 frequently limits where in an IC the circuit may be placed. Assume an IC with a large number of perimeter input/output (I/O) and power supply wire bond pads. In a typical arrangement, large banks of up to twenty I/O circuits (I/O pads and their associated circuitry) are placed. Power pads, which connect to on-chip power supply rails, are typically placed much less frequently, in between banks of I/O circuits. To minimize overall IC area, I/O circuits in a bank are typically abutted, resulting in little or no unused area within the I/O bank. Therefore, ESD clamp circuits typically cannot be placed within banks of I/O circuits. For this reason, the ESD clamp circuits are most typically placed in the vicinity of power pads or in the IC corner regions.

FIG. 2 illustrates a typical implementation of an active MOSFET ESD clamp circuit 19 (as described in FIG. 1) in an integrated circuit 20, to protect multiple I/O circuits 12–15. While only four I/O circuits are shown in this schematic, in a typical implementation the remote ESD clamp circuit may protect a much larger bank of I/O circuits.

The lumped ESD clamp circuit 19 in FIG. 2 is connected between a positive power supply rail (VDD) 21 and a negative power supply rail (VSS) 22. As illustrated in FIG. 1, this clamp circuit contains a trigger circuit, a buffer circuit, and a large MOSFET transistor.

I/O circuit 12 in FIG. 2 includes an I/O pad 23 coupled between the VDD rail 21 and the VSS rail 22. An NMOSFET 24 is connected between the I/O pad 23 and VSS. A PMOSFET 25 is connected between the I/O pad and VDD. NMOSFET 24 serves as the output pull-down buffer while PMOSFET 25 serves as the output pull-up buffer. The gates of NMOSFET 24 and PMOSFET 25 are each connected to output pre-driver circuitry (not shown). A diode 27 has an anode connected to VSS and a cathode connected to the I/O pad. A diode 26 has an anode connected to the I/O pad and a cathode connected to VDD. I/O circuits 13–15, each identical to I/O circuit 12, are also shown in FIG. 2.

A series of resistors R1–R3, Rn, are shown on the VDD rail between each of the I/O circuits. Each resistor represents the distributed parasitic metal resistance for that segment of the VDD rail between two adjacent I/O circuits. Similar resistors may be shown on the VSS rail, but are not included in FIG. 2 in order to clarify the schematic. Note that in a typical IC application, additional I/O circuits and additional resistors, may be placed between I/O circuits 14 and 15 in FIG. 2.

Integrated circuits are often most susceptible to damage during positive ESD events coupled onto an I/O pad referenced to grounded VSS. The primary intended ESD dissipation path for this event applied to I/O pad 23 in FIG. 2 is as follows. The I/O pad voltage rises rapidly as the positive ESD event is applied. Diode 26 forward biases, allowing the VDD power rail voltage to increase as well. The trigger circuit in lumped ESD clamp circuit 19 senses the ESD event, and, via the buffer circuit, turns on the large NMOSFET shunting device. This allows the transient ESD current to flow harmlessly between the VDD and VSS, protecting fragile elements in the I/O circuit. During this ESD event, the I/O pad 23 voltage rises to a peak level set by the sum of the voltage drops as the peak current of the applied ESD event flows through the intended dissipation path. Note that if an equivalent ESD event is applied in turn to each of the I/O pads in FIG. 2, the I/O pad most distant from the lumped ESD clamp circuit will reach the highest peak voltage. This is due to the larger number of series resistors on the VDD power supply rail between the stressed I/O pad and the lumped ESD clamp circuit.

NMOSFET buffer 24 provides an alternate dissipation path for the ESD event described above, and is often the most fragile device in the integrated circuit. During the ESD event, the NMOSFET 24 may conduct as a lateral parasitic NPN bipolar transistor, with the NMOSFET drain diffusion, source diffusion, and local P-type substrate region forming the lateral bipolar collector, emitter, and base regions, respectively. The parasitic bipolar transistor may be capable of conducting a fraction of the peak ESD current before failure. However, if the I/O pad voltage rises above a critical voltage threshold the device will suffer permanent thermal damage. While the magnitude of this critical voltage threshold varies considerably with design options and the semiconductor fabrication technology, values for this failure threshold typically range from seven to ten volts. Therefore, in order to protect I/O circuit 12 from ESD damage, ESD current must be shunted through the lumped ESD clamp circuit 19, in order to limit the voltage at I/O pad 23 below the critical failure voltage defined above.

A limitation with the remote ESD clamp circuit approach illustrated in FIG. 2 is that it becomes increasingly difficult to protect I/O circuit 12 with the lumped ESD clamp circuit 19, as the number of additional I/O circuits between them increases. This is due to the increasing series resistance (R1+R2+R3+ . . . +Rn) in the VDD power supply rail. As an example, assume an IC layout with an 80 micron bond pad pitch and a 22 micron VDD rail width. For a typical metal resistance of 0.07 ohm/square micron, the resultant resistance per pad (Rn) is about 0.25 ohm. If the VDD bus crosses ten (10) pads to reach the ESD clamp circuit, the net VDD bus resistance in the ESD current path will be 2.5 ohms. In the industry standard 200 V Machine Model ESD event, the peak current forced through the IC is approximately 3.0 A. With this peak current, the net VDD bus resistance alone creates an 7.5 volt drop in the ESD current dissipation path. This may exceed the critical voltage threshold for failure of the NMOSFET output buffer 24, even before including the additional voltage drops due to diode 26 and lumped ESD clamp circuit 19.

ESD performance may be improved by increasing the width of the VDD rail 21 to reduce the cumulative resistance, but this comes at the cost of increasing the size of the integrated circuit. Additional ESD clamp circuits may also be placed in parallel with clamp circuit 19, in between the I/O circuits. However, for the typical tightly packed banks of I/O circuits, space for these large clamp circuits is simply not available. To provide for this space between I/O circuits again requires increasing the size of the IC. Therefore, there is a need for an improved, more space efficient ESD clamp circuit scheme which is less sensitive to the effects of cumulative VDD rail resistance when protecting large banks of tightly packed I/O circuits. There is also a need for an ESD clamp circuit scheme which protects all the I/O circuits equally, without the variability seen with varying distance from the lumped ESD clamp circuit as illustrated in FIG. 2. Finally there is a need for an ESD clamp circuit scheme which is highly flexible and modular so that the same approach may be applied to multiple IC designs with only minimal concern for VDD rail resistance or the number of I/O circuits in an I/O bank.

BRIEF DESCRIPTION OF THE DRAWINGS

The present invention is illustrated by way of example and not limitation in the accompanying figures, in which like references indicate similar elements, and in which.

Figure 1:
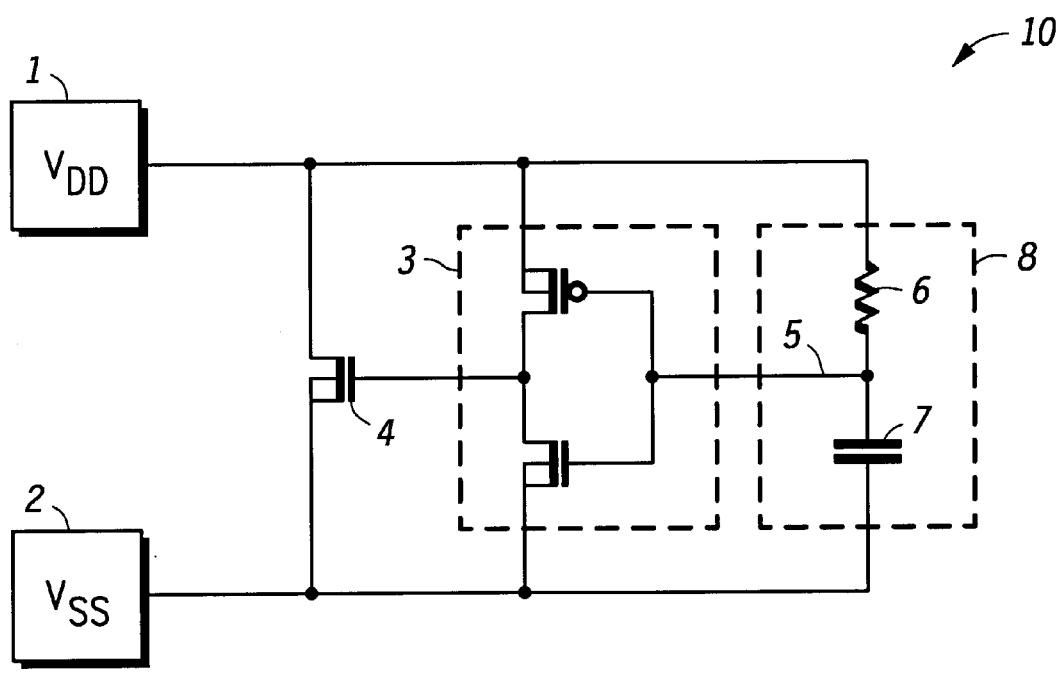
FIG. 1 illustrates in circuit diagram form a prior art ESD clamp circuit.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Embodiments of the present invention provides an ESD protection network where an array of individual ESD protection circuits are coupled in parallel between a positive bus and a grounded supply bus and distributed among each I/O circuit to be protected. A trigger for controlling the individual ESD protection circuits both during an ESD event, and during normal circuit operation, is placed in a location remote from the I/O circuits to be protected. The remote trigger circuit detects a positive ESD event coupled to any one of the I/O pads and in response enables a plurality of the individual ESD protection circuits in the array. In one embodiment, the remote trigger circuit employs a resistor-capacitor (RC) transient detector with a characteristic RC time constant set to exceed the duration of an ESD event (typically a few microseconds). Since a large substrate area is required to achieve this RC time constant, it is area efficient to control multiple distributed ESD protection circuits with a remote trigger circuit.

In one embodiment, the individual ESD protection circuits and the remote trigger circuit are coupled between a positive power supply bus and a grounded power supply bus each connected to a power supply external to the IC. In an alternate embodiment the positive bus may not directly connect to an external power supply. The positive bus may be referred to as the VDD bus or the ESD Bus. The grounded power supply bus, also referred to as the VSS bus, may be coupled to the silicon substrate to allow the substrate to conduct in parallel with the VSS bus metal.

In one embodiment of the present invention, an integrated circuit having a VSS power supply bus and an ESD bus includes a plurality of input/output (I/O) pads coupled to the ESD bus and the VSS power supply bus, and a plurality of individual transistors, wherein each individual transistor is coupled to a corresponding I/O pad. The plurality of individual transistors operate in parallel in response to an ESD event on at least one of the plurality of I/O pads to provide ESD protection for the plurality of I/O pads.

In another embodiment, a distributed transistor circuit for ESD protection having a VSS power supply bus and an ESD bus includes a plurality of I/O circuits coupled to the ESD bus and the VSS power supply bus, and a plurality of distributed transistors. Each of the plurality of I/O circuits includes one of the plurality of distributed transistors and each transistor has a first current electrode coupled to the ESD bus, a second current electrode coupled to the VSS bus, and a control electrode. The distributed transistor circuit further includes a trigger circuit corresponding to the plurality of distributed transistors and having a first terminal coupled to the ESD bus and a second terminal coupled to each of the control electrodes of the distributed transistors via a trigger bus.

In many ESD protection schemes, the I/O circuit ESD robustness is dependent on the ESD bus resistance between the I/O pad under test and the infrequently placed lumped ESD clamp circuits. However, by distributing the individual ESD protection circuits among all the I/O pads to be protected, the ESD robustness varies little from pad to pad. When any I/O pad experiences a positive ESD event referenced to grounded VSS, the individual ESD protection circuits, located at each of the multiple I/O circuits, turn on in parallel. In a large bank of I/O circuits, ESD protection circuits clustered within an ohm of ESD bus resistance of the stressed I/O pad tend to shunt the majority of the ESD current. However, independent of the location of the stressed I/O pad, a plurality of individual ESD protection circuits in the array work in tandem to provide a low resistance primary path between the ESD bus and the VSS bus. The cumulative effect of the individual protection devices allows multiple small devices to handle very large ESD currents.

It is an advantage of some embodiments of the present invention that each of the individual ESD protection circuits, utilizing a separate remote trigger circuit, occupy a small substrate area. The individual ESD protection circuits typically occupy only 10 percent or less of the area of the prior art lumped ESD clamp circuit. This area is small enough so that the individual ESD protection circuits may be easily fit into the I/O circuit area with only minimal impact on overall IC area.

Figure 3:
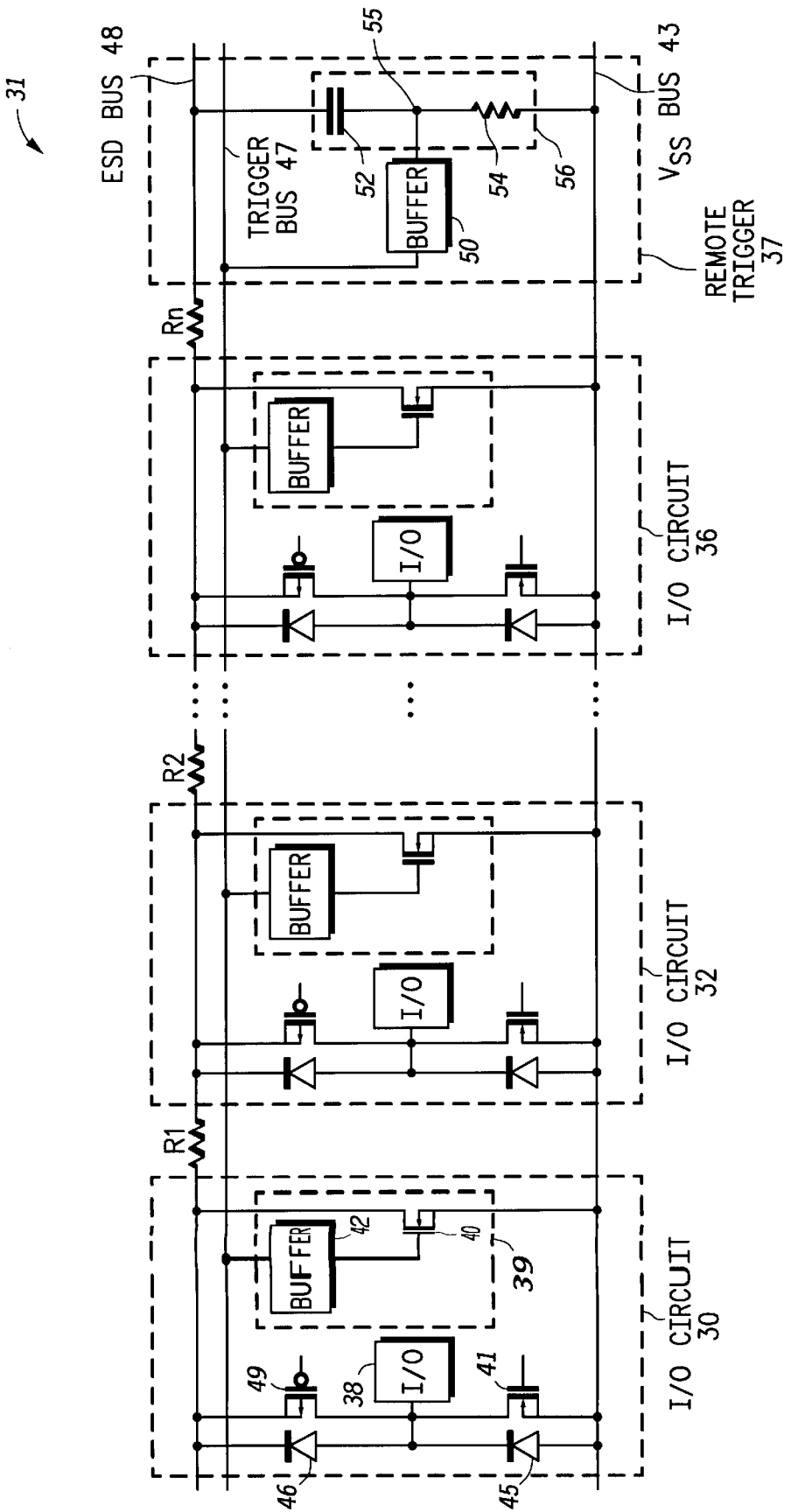
FIG. 3 illustrates in circuit diagram form a distributed ESD protection circuit, according to one embodiment of the present invention.

FIG. 3 illustrates one embodiment of the present invention, where ESD protection is provided within integrated circuit 31. The integrated circuit 31 includes a variety of circuit portions including I/O circuits 30, 32, and 36, and a remote trigger circuit 37. Each of these circuit portions is coupled between a positive ESD bus 48 and a grounded VSS bus 43. A series of resistors R1, R2, and Rn are shown on the ESD bus 48 between each of the I/O circuits. Each resistor represents the distributed parasitic metal resistance for that segment of the ESD bus 48 between two adjacent I/O circuits. In addition to the I/O circuits 30, 32, and 36 and resistors R1, R2, and Rn shown in FIG. 3, it is assumed that a variable number of additional I/O circuits and VDD bus resistors may be placed between I/O circuits 32 and 36. Alternate embodiments may even include less I/O circuits than those illustrated in FIG. 3.

I/O circuit 30 includes an output buffer PMOSFET 49 and a diode 46 coupled between an I/O pad 38 and the ESD bus 48, and an output buffer NMOSFET 41 and a diode 45 coupled between the I/O pad 38 and the VSS bus 43. I/O circuit 30 further includes an individual ESD protection circuit 39 coupled between the ESD bus 48 and the VSS bus 43. In this embodiment the individual ESD protection circuit 39 comprises a first buffer circuit 42 and an NMOSFET 40. The drain of NMOSFET 40 is coupled to the ESD bus 48, while the source is coupled to the VSS bus 43. Alternate embodiments may replace the NMOSFET 40 with another type of transistor. The first buffer circuit 42 is configured with an input coupled to a trigger bus 47 and an output coupled to a control terminal of NMOSFET 40. The individual ESD protection circuit 39 provides a direct current path between the ESD bus 48 and the VSS bus 43 during an ESD event. Note that the individual ESD protection circuits 39 contained within each of the I/O circuits are coupled in parallel to provide distributed ESD protection independent of which I/O pad receives the ESD event. I/O circuits 32 and 36 are similar to I/O circuit 30. In this embodiment, they include the same circuitry as is found in I/O circuit 30, as shown in FIG. 3.

Each of the ESD protection circuits, such as ESD protection circuit 39, contained within I/O circuits 30, 32, and 36 are controlled by a remote trigger circuit 37 via the trigger bus 47, which couples the output of the remote trigger circuit 37 to the input of the ESD protection circuit 39. In this embodiment of the invention, the remote ESD trigger circuit 37 comprises an RC transient detector 56, including a resistive element 54 and a capacitive element 52, and a second buffer circuit 50. Resistive element 54 is coupled between the VSS bus 43 and a node 55. Capacitive element 52 is coupled between node 55 and the ESD bus 48.

The second buffer circuit 50 serves to amplify the weak signal produced by the RC transient detector 56 to a signal level sufficient to drive the trigger bus 47. This may be accomplished with customary circuit means, utilizing for example, a series of one or more inverting buffer stages. The first buffer circuits, such as the first buffer circuit 42, located in each of the individual ESD protection circuits, serves to amplify the signal on the trigger bus 47 to a signal level sufficient to fully enable NMOSFET 40 during an ESD event. With resistive element 54 and capacitive element 52 configured as shown in FIG. 3 the first and second buffer circuits together may utilize, for example, an even number of inverting buffer stages.

In an alternate embodiment of integrated circuit 31 in FIG. 3, resistive element 54 and capacitive element 52 may be flipped about node 55 so that the resistive element is coupled to the ESD bus 48 and the capacitive element is coupled to the VSS bus 43. With the RC transient detector 56 configured in this way, the first and second buffer circuits together may utilize, for example, an odd number of inverting buffer stages.

In a further alternate embodiment of integrated circuit 31 in FIG. 3, the first and second buffer circuits may be merged into a single effective buffer circuit and placed within remote trigger circuit 37. In this embodiment, the individual ESD protection circuits of I/O circuit 30, 32, and 36 would comprise only the NMOSFET and not the first buffer circuit. For example, ESD protection circuit 39 would comprise only the NMOSFET 40, with the trigger bus 47 coupled to the control terminal of NMOSFET 40.

Figure 2:
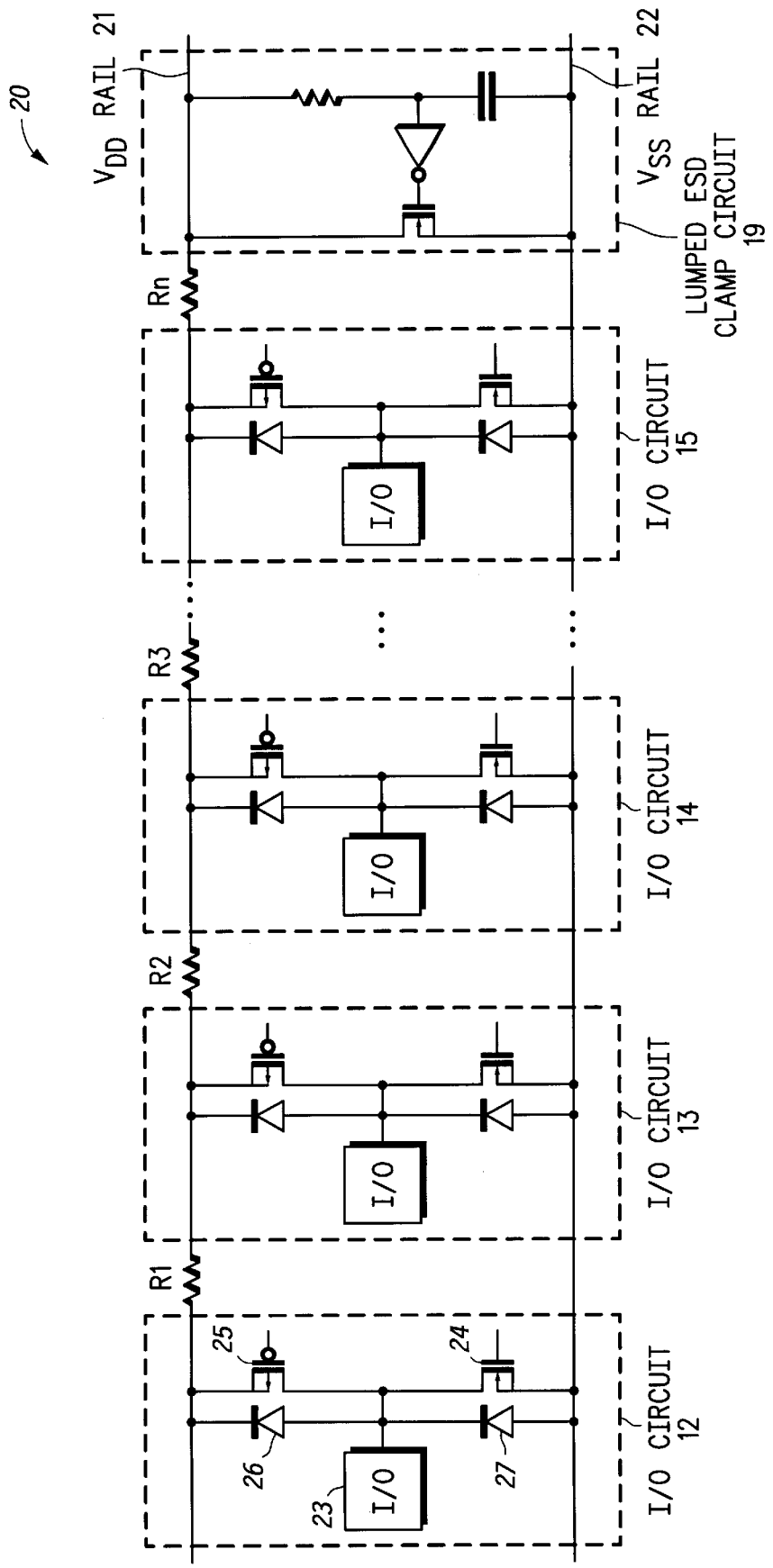
FIG. 2 illustrates in circuit diagram form a prior art ESD protection circuit.

In the many ESD protection schemes (such as those described in reference to FIGS. 1 and 2), an ESD event in the integrated circuit results in current flowing from the I/O pad where the ESD event is applied to a single large ESD clamp circuit. Depending on the proximity of the ESD clamp circuit to the stressed I/O pad, the resistance of the ESD bus may be substantial leading to intolerable voltage build up. In contrast, embodiments of the present invention replaces the single large or lumped ESD clamp circuit with individual smaller ESD protection circuits in close proximity to each I/O pad while maintaining the trigger circuit in a remote location. This ESD protection system having individual protection circuits effectively acts like a single large protection network, where the cumulative effect of the local individual ESD protection circuits results in increased protection of the integrated circuit. Having multiple individual ESD protection circuits in close proximity to each I/O pad greatly relaxes the limitations on ESD bus resistance as compared to the lumped ESD protection scheme. It is an advantage of some embodiments of the present invention that the ESD bus may be designed much smaller (more resistive) than those in the lumped ESD approach to achieve robust ESD protection for each I/O circuit.

In one embodiment, the NMOSFET 40 in FIG. 3 has a channel width of at most approximately 300 microns, and a channel length of at most approximately 0.6 microns. The parasitic metal resistance for each segment of the trigger bus 47 between two adjacent I/O circuits (not shown specifically in FIG. 3) is approximately 5 ohms. The parasitic metal resistance (Rn) for each segment of the ESD bus between two adjacent I/O circuits is approximately 0.25 ohms. Therefore a total of nine individual ESD protection circuits, with a cumulative NMOSFET 40 channel width of 2700 microns, are present within one ohm of ESD bus resistance of any stressed I/O pad. This total includes the ESD protection circuit local to the stressed I/O pad, plus four ESD protection circuits in either direction along the ESD bus.

In one embodiment, the MOSFET 40 of the ESD protection circuit 39 has a gate size of approximately 250 microns and a channel length of at most approximately 0.5 microns. In this embodiment, the pad experiencing an ESD event sees an effective ESD protection having 2250 micron device width with 0.5 micron channel length within approximately 1 ohm of ESD bus line resistance. Embodiments of the present invention, therefore, provide a network of smaller protection circuits which may be distributed along a resistive ESD bus, yet still provide robust ESD protection for any I/O pad experiencing an ESD event.

In addition to the placement in I/O circuits as shown in FIG. 3, the individual ESD protection circuit 39 may also be placed at power supply pads, in cells placed between I/O or power pads, or wherever adequate space is available. One intent is to provide these ESD protection circuits widely distributed along the ESD bus so that any stressed I/O pad will see multiple ESD protection circuits within an ohm of ESD bus metal. The remote trigger circuit 37 as shown in FIG. 3 may be placed at power supply pads, in cells placed between I/O or power pads, or wherever adequate space is available. Embodiments of the present invention allow for an ESD protection scheme that may be application and design independent and that may be implemented in a standard cell design method. The individual ESD protection circuit 39 may be formed with the ESD bus 48, thereby incurring no increase in layout area of the integrated circuit. When placed at the edge of a pad, the ESD protection circuit 39 may be formed in a double layer metal, even within a three layer metal process.

Figure 4:
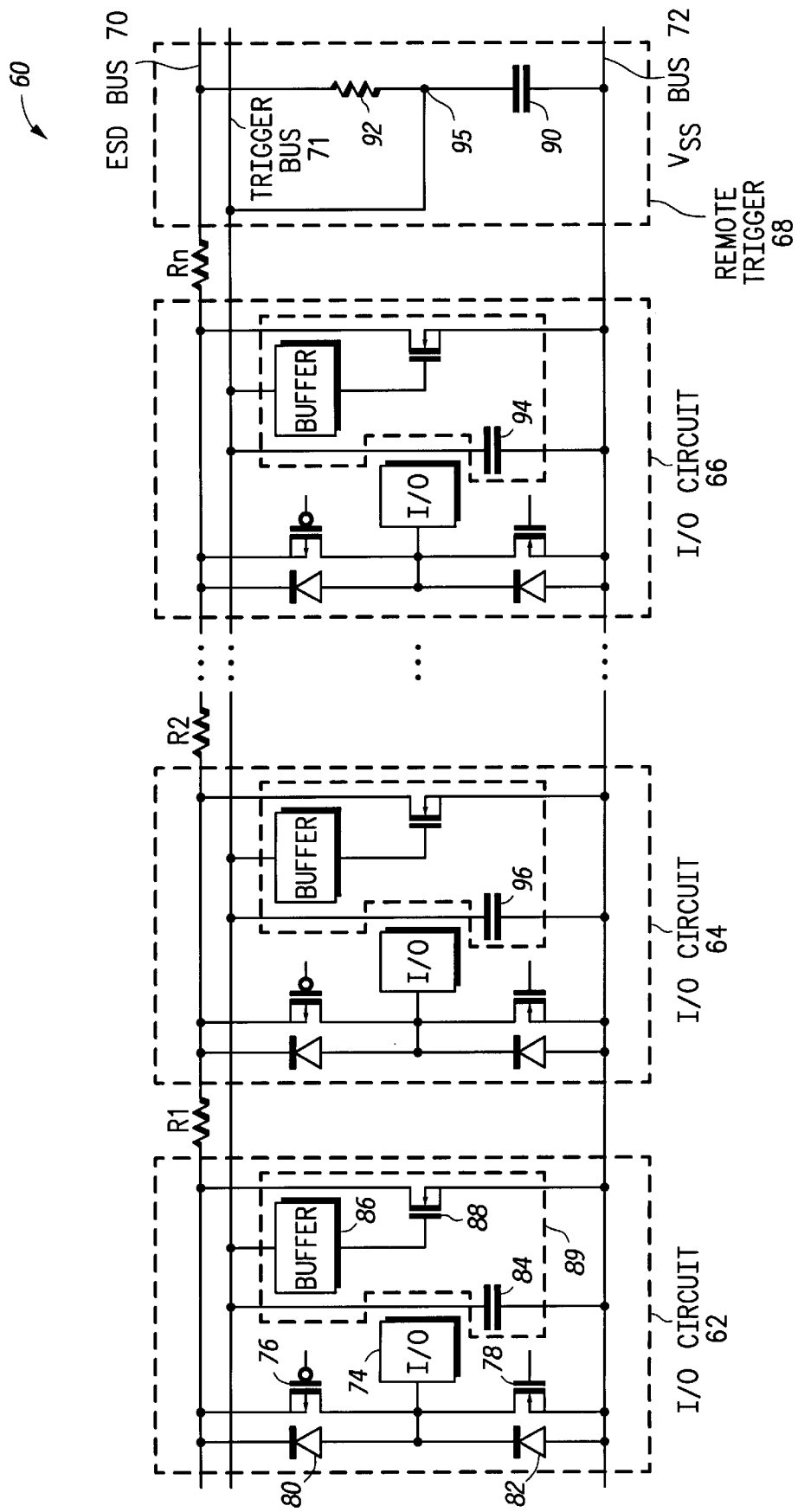
FIG. 4 illustrates in circuit diagram form a distributed ESD protection circuit according to another embodiment of the present invention.

An alternate embodiment of the present invention is illustrated in FIG. 4. The integrated circuit 60 includes a variety of circuit portions including I/O circuits 62, 64, and 66, and a remote trigger circuit 68. Each of these circuit portions is coupled between a positive ESD bus 70 and a grounded VSS bus 72. A series of resistors R1, R2, and Rn are shown on the ESD bus between each of the I/O circuits. Each resistor represents the distributed parasitic metal resistance for that segment of the ESD bus between two adjacent I/O circuits. In addition to the I/O circuits and resistors shown in FIG. 4, it is assumed that a variable number of additional I/O circuits and VDD bus resistors may be placed between I/O circuits 64 and 66. I/O circuit 62 includes an output buffer PMOSFET 76 and a diode 80 coupled between an I/O pad 74 and the ESD bus 70, and an output buffer NMOSFET 78 and a diode 82 coupled between the I/O pad 74 and the VSS bus 72. I/O circuit 62 further includes an individual ESD protection circuit 89 coupled between the ESD bus 70 and the VSS bus 72. In this embodiment, the individual ESD protection circuit 89 comprises a buffer circuit 86, an NMOSFET 88, and a capacitive element 84. The buffer circuit 86 is configured with an input coupled to a trigger bus 71 and an output coupled to the control terminal of NMOSFET 88. The drain of NMOSFET 88 is coupled to the ESD bus 70, while the source is coupled to the VSS bus 72. Alternate embodiments may replace the NMOSFET with another type of transistor. Capacitive element 84 is coupled between the trigger bus 71 and the VSS bus 72. The individual ESD protection circuit 89 provides a direct current path between the ESD bus 70 and the VSS bus 72 during an ESD event. I/O circuits 64 and 66 are both similar to I/O circuit 62, containing the same circuitry as I/O circuit 62, as illustrated in FIG. 4. Note that the individual ESD protection circuits, such as ESD protection circuit 89, contained within each of the I/O circuits 62, 64, and 66 are coupled in parallel to provide distributed ESD protection independent of which I/O pad the ESD event is applied.

Each of the ESD protection circuits contained within I/O circuits 62, 64, and 66 are controlled by a remote trigger circuit 68 via the trigger bus 71, which couples the output of the remote trigger circuit 68 to the input of each of the ESD protection circuits. In this embodiment, the remote ESD trigger circuit 68 comprises an RC transient detector, consisting of resistive element 92 and capacitive element 90. Resistive element 92 is coupled between the ESD bus and a node 95. Capacitive element 90 is coupled between node 95 and the VSS bus. Node 95 is coupled to the trigger bus 71.

Capacitive elements 84, 96, and 94 in each of the individual ESD protection circuits are each coupled between the trigger bus 71 and the VSS bus 72 in parallel with capacitive element 90 and serve to increase the effective RC time constant of the RC transient detector in the remote trigger circuit 68. Capacitor 90 may therefore be optionally reduced in size so that capacitive element 90 working in tandem with the additional capacitive elements 84, 96, and 94 distributed along the trigger bus 71, and resistor 92, produce the required RC time constant. In an alternate embodiment, capacitive element 90 may be eliminated entirely, with the RC transient detector formed from resistor 92 and the capacitive elements 84, 96, and 94 distributed along the trigger bus.

The buffer circuit 86 serves to amplify the weak signal produced by the RC transient detector via trigger bus 71 to a signal level sufficient to drive the control terminal of NMOSFET 88. This buffer circuit may be accomplished with customary circuit means, utilizing for example, a series of one, three, or five inverting buffer stages.

Embodiments of the present invention provides an ESD protection network where an array of individual ESD protection circuits are coupled in parallel between a positive bus and a grounded supply bus and distributed among each I/O circuit to be protected. A trigger for controlling the individual ESD protection circuits both during an ESD event, and during normal circuit operation, is placed in a location remote from the I/O circuits to be protected. The effective ESD bus resistance is thus reduced between any stressed I/O pad and the cumulative ESD protection circuits required to shunt the ESD current harmlessly to VSS. This allows for a modular, space efficient ESD protection scheme which protects all the I/O circuits in an IC equally.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit having a VSS power supply bus and an Electrostatic Discharge (ESD) bus, comprising:
   a plurality of input/output (I/O) pads coupled to the ESD bus and the VSS power supply bus; and
   a plurality of individual transistors, wherein:
      each individual transistor is coupled to a corresponding I/O pad; and
      the plurality of individual transistors operate in parallel in response to an ESD event on at least one of the plurality of I/O pads to provide ESD protection for the plurality of I/O pads.

2. The integrated circuit of claim 1, wherein each of the plurality of individual transistors includes a first current electrode, a second current electrode, and a control electrode, and wherein the first current electrode is coupled to the ESD bus, and the second current electrode is coupled to the VSS power supply bus.

3. The integrated circuit of claim 2, further comprising a remote trigger circuit having a first terminal coupled to the ESD bus and a second terminal coupled to each of the control electrodes of the plurality of individual transistors via a trigger bus.

4. The integrated circuit of claim 3, wherein the remote trigger circuit is located at one of a power supply pad, a cell between two power supply pads, a cell between two I/O pads, and a cell between a power supply pad and an I/O pad.

5. The integrated circuit of claim 3, wherein at least one of the purality of distributed transistors if located adjacent to a power supply pad.

6. The integrated circuit of claim 3, wherein the integrated circuit further comprises a buffer circuit coupled between the trigger bus and the second terminal of the remote trigger circuit.

7. The integrated circuit of claim 3, further comprising a plurality of buffer circuits, wherein each of the plurality of buffer circuits is coupled between the trigger bus and the control electrode of at least one of the plurality of individual transistors.

8. The integrated circuit of claim 7, wherein the remote trigger circuit further comprises a remote buffer circuit coupled between the trigger bus and the second terminal of the remote trigger circuit.

9. The integrated circuit of claim 3, wherein the remote trigger circuit comprises a first capacitive element and a first resistive element, wherein:
   a first terminal of the first resistive element is coupled to the ESD bus,
   a second terminal of the first resistive element is coupled to the second terminal of the remote trigger circuit and a first terminal of the first capacitive element, and
   a second terminal of the first capacitive element is coupled to the VSS power supply bus.

10. The integrated circuit of claim 9, further comprising a plurality of capacitive elements, wherein each capacitive element of the plurality of capacitive elements has a first terminal coupled to the control electrode of at least one of the plurality of individual transistors and a second terminal coupled to the VSS power supply bus.

11. The integrated circuit of claim 3, further comprising a plurality of capacitive elements, wherein each capacitive element of the plurality of capacitive elements has a first terminal coupled to the control electrode of at least one of the plurality of individual transistors and a second terminal coupled to the VSS power supply bus.

12. The integrated circuit of claim 1, wherein each of the individual transistors is an N-channel MOS transistor.

13. The integrated circuit of claim 12, wherein the N-channel MOS transistor has a corresponding gate size of at most approximately 300 microns and a corresponding channel length of at most approximately 0.6 microns.

14. The integrated circuit of claim 1, wherein the plurality of individual transistors provide a primary discharge path upon occurrence of the ESD event.

15. A distributed transistor circuit for Electrostatic Discharge (ESD) protection having a VSS power supply bus and an Electrostatic Discharge (ESD) bus, comprising:
   a plurality of input/output (I/O) circuits coupled to the ESD bus and the VSS power supply bus;
   a plurality of distributed transistors, wherein:
      each of the plurality of I/O circuits includes one of the plurality of distributed transistors, and
      each distributed transistor has a first current electrode coupled to the ESD bus, a second current electrode coupled to the VSS bus, and a control electrode; and
   a trigger circuit corresponding to the plurality of distributed transistors, having a first terminal coupled to the ESD bus, and a second terminal coupled to each of the control electrodes of the distributed transistors via a trigger bus.

16. The circuit of claim 15, further comprising a plurality of buffer circuits wherein each buffer circuit is coupled between the control electrode of a corresponding distributed transistor and the trigger bus.

17. The circuit of claim 15, wherein the I/O circuit further comprises an output buffer coupled to the ESD bus and the VSS power supply bus.

18. The circuit of claim 15, further comprising a plurality of capacitive elements, wherein each capacitive element of the plurality of capacitive elements has a first terminal coupled to the control electrode of at least one of the plurality of distributed transistors and a second terminal coupled to the VSS power supply bus.

19. The circuit of claim 15, wherein the trigger circuit is a remote trigger circuit located at one of a power supply pad, a cell between two power supply pads, a cell between two I/O circuits, and a cell between a power supply pad and an I/O circuit.

20. The circuit of claim 15, wherein each of the distributed transistors is an N-channel MOS transistor.

21. The circuit of claim 20, wherein the N-channel MOS transistor has a corresponding gate size of at most approximately 300 microns and a corresponding channel length of at most approximately 0.6 microns.

22. The circuit of claim 15, wherein the plurality of distributed transistors operate in parallel and provide ESD protection through a primary discharge path upon occurrence of an ESD event.

* * * * *